(12) United States Patent
Yi et al.

(10) Patent No.: US 12,029,091 B2
(45) Date of Patent: Jul. 2, 2024

(54) DISPLAY PANEL AND DISPLAY DEVICE

(71) Applicant: Wuhan China Star Optoelectronics Semiconductor Display Technology Co., Ltd., Hubei (CN)

(72) Inventors: Chujun Yi, Hubei (CN); Tao Chen, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 446 days.

(21) Appl. No.: 17/275,204

(22) PCT Filed: Dec. 15, 2020

(86) PCT No.: PCT/CN2020/136505
§ 371 (c)(1),
(2) Date: Mar. 11, 2021

(87) PCT Pub. No.: WO2022/095229
PCT Pub. Date: May 12, 2022

(65) Prior Publication Data
US 2022/0310706 A1 Sep. 29, 2022

(30) Foreign Application Priority Data
Nov. 9, 2020 (CN) .......................... 202011241192.7

(51) Int. Cl.
*H10K 59/35* (2023.01)
*H10K 59/12* (2023.01)

(52) U.S. Cl.
CPC ........... *H10K 59/353* (2023.02); *H10K 59/12* (2023.02); *H10K 59/352* (2023.02)

(58) Field of Classification Search
CPC ............ H10K 59/351–353; G09G 2310/0232
See application file for complete search history.

(56) References Cited

U.S. PATENT DOCUMENTS

| 2019/0147803 A1* | 5/2019 | Liu | ...................... | G09G 3/3233 |
| | | | | 345/204 |
| 2021/0151517 A1* | 5/2021 | Zhu | ...................... | H10K 50/852 |

(Continued)

FOREIGN PATENT DOCUMENTS

| CN | 109036121 | 12/2018 |
| CN | 110379836 | 10/2019 |

(Continued)

OTHER PUBLICATIONS

International Search Report and the Written Opinion dated Aug. 13, 2021 From the International Searching Authority Re. Application No. PCT/CN2020/136505 and Its Translation Into English. (12 Pages).

*Primary Examiner* — Eric K Ashbahian

(57) ABSTRACT

A display panel and a display device are provided. The display panel includes a main display region, a sub display region, a plurality of first pixel repeating units disposed in the main display region, and a plurality of second pixel repeating units disposed in the sub display region. A bend line boundary is firmed between the main display region and the sub display region. The bend line boundary includes a plurality of bending units. Each bending unit corresponds to at least one second pixel repeating unit, so that the pixel repeating units of the sub display region are consistent with the pixel repeating units at its edge, and a display difference is reduced.

11 Claims, 8 Drawing Sheets

(56) References Cited

U.S. PATENT DOCUMENTS

2021/0151519 A1\* 5/2021 Lv .......................... H10K 71/00
2022/0077430 A1\* 3/2022 Choi ....................... H10K 59/38
2022/0123094 A1\* 4/2022 Qiu ...................... H10K 59/353

FOREIGN PATENT DOCUMENTS

| CN | 110767706 | 2/2020 |
| CN | 211554560 | 9/2020 |
| WO | WO 2019/062236 | 4/2019 |

\* cited by examiner

DISPLAY PANEL AND DISPLAY DEVICE

RELATED APPLICATIONS

This application is a National Phase of PCT Patent Application No. PCT/CN2020/136505 having International filing date of Dec. 15, 2020, which claims the benefit of priority of Chinese Patent Application No. 202011241192.7 filed on Nov. 9, 2020. The contents of the above applications are all incorporated by reference as if fully set forth herein in their entirety.

FIELD AND BACKGROUND OF THE INVENTION

The present disclosure relates to the field of display technologies, and in particular to a display panel and a display device.

Full-screen displays bring people a brand-new visual experience and sensory impact due to its extremely high screen-to-body ratio, and have become a goal of display panel manufacturers.

At present, a common design of an under-screen camera is to form a hole in a camera area of a display panel. No image is displayed in a camera light-transmitting area. In this way, a transmission rate of the panel will be relatively high, but user's display experience is not good, and a full-screen display cannot be achieved. In another way, a sub display region is formed on a display panel, and an under-screen camera is disposed correspondingly to the sub display region. The sub display region can adjust a light transmittance and be provided with display pixels, so that the camera can take pictures and the sub display region can display normally. However, in existing under-screen camera technologies, display performance of the sub display region and that of its edge are different, and further improvement is needed to solve it.

Therefore, it is necessary to provide a display panel and a display device to solve the above technical problems.

SUMMARY OF THE INVENTION

The present disclosure provides a display panel and a display device, to solve technical problems of display performance of a sub display region being different from that of its edge in existing display panel and display device.

In order to solve the above problems, the technical solutions provided by the present disclosure are as follows.

An embodiment of the present disclosure provides a display panel, including a main display region, at least one sub display region, a plurality of first pixel repeating units disposed in the main display region, and a plurality of second pixel repeating units disposed in the sub display region. A number of the first pixel repeating units in the main display region per unit area is equal to a number of the second pixel repeating units in the sub display region per unit area.

A bend line boundary is formed between the main display region and the sub display region, the bend line boundary includes a plurality of bending units, each of the bending units corresponds to at least one of the second pixel repeating units, each of the bending units includes a first bending edge and a second bending edge that intersect each other, and both the first bending edge and the second bending edge correspond to at least one of the second pixel repeating units.

According to the display panel of an embodiment of the present disclosure, the first bending edge corresponds to M second pixel repeating units, and the second bending edge corresponds to N second pixel repeating units. M is a positive integer and N is a positive integer.

According to the display panel of an embodiment of the present disclosure, both the first bending edge and the second bending edge correspond to at least one of the first pixel repeating units.

According to the display panel of an embodiment of the present disclosure, the first bending edge corresponds to P first pixel repeating units, and the second bending edge corresponds to Q first pixel repeating units. P is a positive integer and Q is a positive integer.

According to the display panel of an embodiment of the present disclosure, an included angle between the first bending edge and the second bending edge is 90 degrees.

According to the display panel of an embodiment of the present disclosure, the bend line boundary includes a first symmetry axis and a second symmetry axis, the first symmetry axis and the second symmetry axis have an intersection point, sizes of plurality of the first bending edges gradually increase in a direction parallel to the first symmetry axis and toward the intersection point, and sizes of plurality of the second bending edges gradually increase in a direction parallel to the second symmetry axis and toward the intersection point.

An embodiment of the present disclosure provides a display panel, including a main display region, at least one sub display region, a plurality of first pixel repeating units disposed in the main display region, and a plurality of second pixel repeating units disposed in the sub display region.

A bend line boundary is formed between the main display region and the sub display region, the bend line boundary includes a plurality of bending units, each of the bending units corresponds to at least one of the second pixel repeating units.

According to the display panel of an embodiment of the present disclosure, each of the bending units includes a first bending edge and a second bending edge that intersect each other, and both the first bending edge and the second bending edge correspond to at least one of the second pixel repeating units.

According to the display panel of an embodiment of the present disclosure, the first bending edge corresponds to M second pixel repeating units, and the second bending edge corresponds to N second pixel repeating units. M is a positive integer and N is a positive integer.

According to the display panel of an embodiment of the present disclosure, both the first bending edge and the second bending edge correspond to at least one of the first pixel repeating units.

According to the display panel of an embodiment of the present disclosure, the first bending edge corresponds to P first pixel repeating units, and the second bending edge corresponds to Q first pixel repeating units. P is a positive integer and Q is a positive integer.

According to the display panel of an embodiment of the present disclosure, an included angle between the first bending edge and the second bending edge is 90 degrees.

According to the display panel of an embodiment of the present disclosure, the bend line boundary includes a first symmetry axis and a second symmetry axis, the first symmetry axis and the second symmetry axis have an intersection point, sizes of plurality of the first bending edges gradually increase in a direction parallel to the first symmetry axis and toward the intersection point, and sizes of plurality of the second bending edges gradually increase in a direction parallel to the second symmetry axis and toward the intersection point.

According to the display panel of an embodiment of the present disclosure, the first symmetry axis is arranged perpendicular to the second symmetry axis, the first bending edge is arranged parallel to the first symmetry axis, and the second bending edge is arranged parallel to the second symmetry axis.

According to the display panel of an embodiment of the present disclosure, a number of the first pixel repeating units in the main display region per unit area is equal to a number of the second pixel repeating units in the sub display region per unit area.

According to the display panel of an embodiment of the present disclosure, the first pixel repeating units include a plurality of first sub-pixels, and the second pixel repeating units include a plurality of second sub-pixels; and An arrangement of the plurality of first sub-pixels in the main display region is consistent with an arrangement of the plurality of second sub-pixels in the sub display region.

According to the display panel of an embodiment of the present disclosure, a pixel aperture area of the first sub-pixels is greater than a pixel aperture area of the second sub-pixels.

According to the display panel of an embodiment of the present disclosure, the display panel further includes a plurality of pixel drive circuit units disposed in the sub display region and configured to drive the second sub-pixels to emit light.

A plurality of the second sub-pixels with a same color in the second pixel repeating units are electrically connected to one of the pixel drive circuit units.

According to the display panel of an embodiment of the present disclosure, the sub display region includes a display and light transmission area and a transition and display area between the main display region and the display and light transmission area, and the bend line boundary is formed between the main display region and the transition and display area.

The pixel drive circuit units are disposed in the transition and display area.

An embodiment of the present disclosure provides a display device, including the display panel mentioned above and a photosensitive element.

The photosensitive element is disposed on one side of the display panel and corresponds to the sub display region.

Advantages of the present disclosure are as follows. In the display panel and the display device of the present disclosure, the bend line boundary is formed between the main display region and the sub display region. The bend line boundary includes the plurality of bending units. Each bending unit corresponds to at least one second pixel repeating unit disposed in the sub display region, so that the second pixel repeating unit disposed at the bend line boundary between the main display region and the sub display region is complete. Therefore, the pixel repeating units of the sub display region are consistent with the pixel repeating units at its edge, which can reduce a display difference between the sub display region and its edge, and improve visual performance of the sub display region.

BRIEF DESCRIPTION OF THE SEVERAL VIEWS OF THE DRAWINGS

In order to more clearly describe the embodiments or the technical solutions in the prior art, the following will briefly introduce the drawings that need to be used in the description of the embodiments or the prior art. Apparently, the drawings in the following description are merely some embodiments of the invention. For those of ordinary skill in the art, other drawings may be obtained from these drawings without creative efforts.

DESCRIPTION OF SPECIFIC EMBODIMENTS OF THE INVENTION

Figure 1:
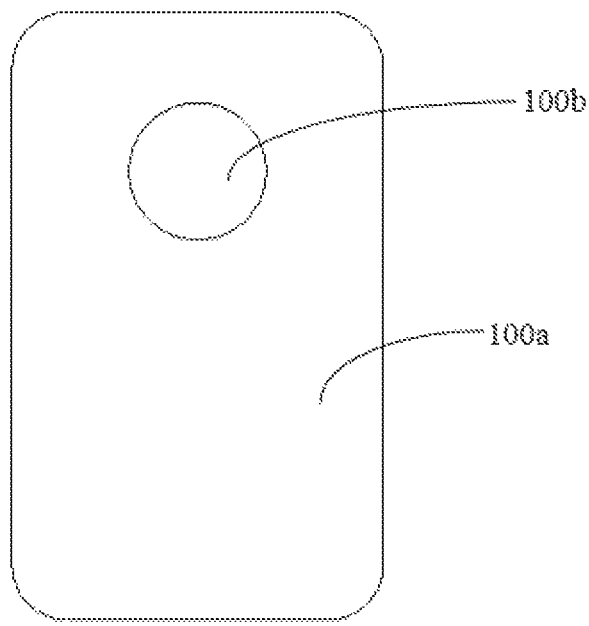
FIG. 1 is a plan view of a display panel of an embodiment of the present disclosure.

The description of the following embodiments refers to the attached drawings to illustrate specific embodiments that the present disclosure can be implemented. Direction terms mentioned in the present disclosure, such as top, bottom, front, back, left, right, inside, outside, side, etc., only refer to the directions of the attached drawings. Therefore, the directional terms are used to explain and understand the present disclosure, not to limit the present disclosure. In the drawings, units with similar structures are indicated by the same reference numerals.

Please refer to FIG. 1, which is a plan view of a display panel of an embodiment of the present disclosure. The display panel is an active matrix organic light emitting diode display panel. The display panel includes a main display region 100a and at least one sub display region 100b. The main display region 100a is a region mainly configured to display images. The sub display region 100b can be configured to display images and can allow light to pass through, so that a photosensitive element disposed on one side of the display panel and corresponding to the sub display region 100b receives light signals. The photosensitive element may be a camera, an optical touch component, a fingerprint recognition sensor, etc., so that the display panel can realize functions such as photographing, optical touch, and optical fingerprint recognition. The display panel may include a plurality of the sub display regions 100b. It should be noted that, in order to facilitate the description of the technical solutions of the embodiments of the present disclosure, the present disclosure is described by taking the display panel having one sub display region 100b and the photosensitive element as a camera as the embodiments.

Figure 2:
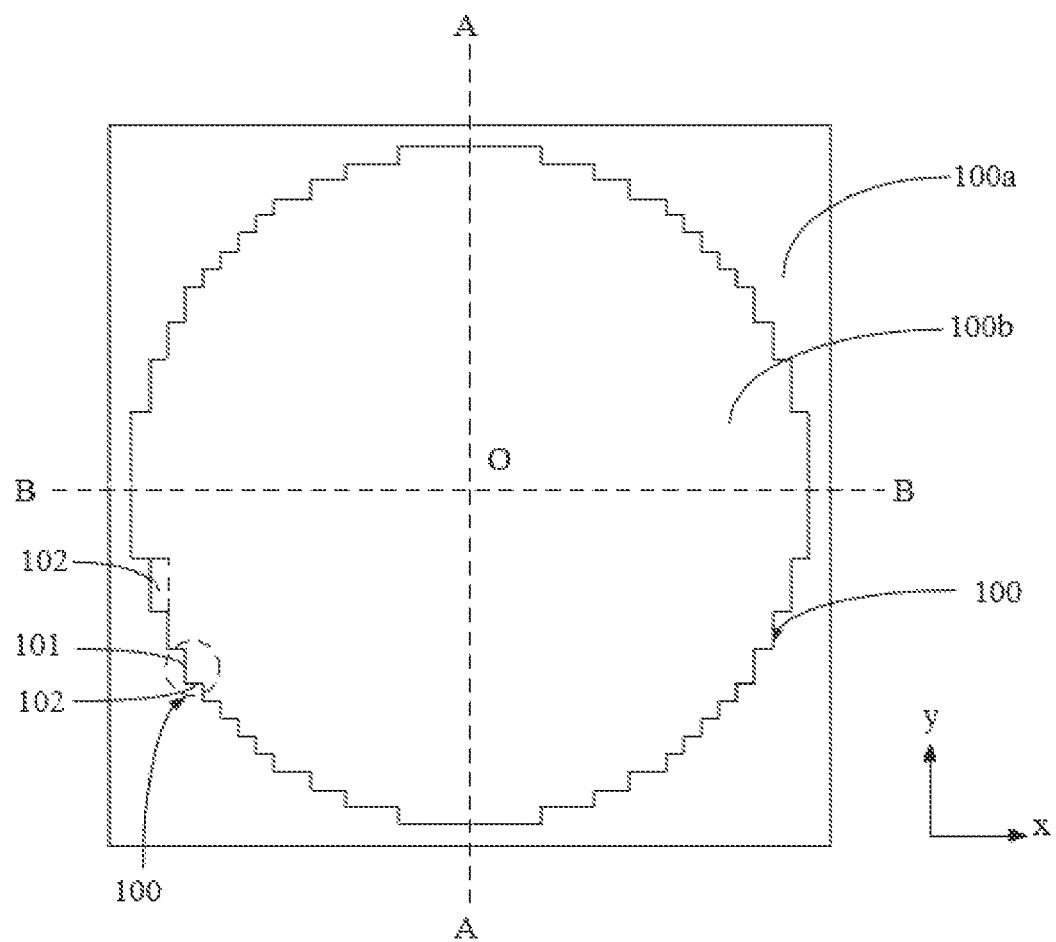
FIG. 2 is a schematic diagram of a partial structure of the display panel in FIG. 1.
Figure 3:
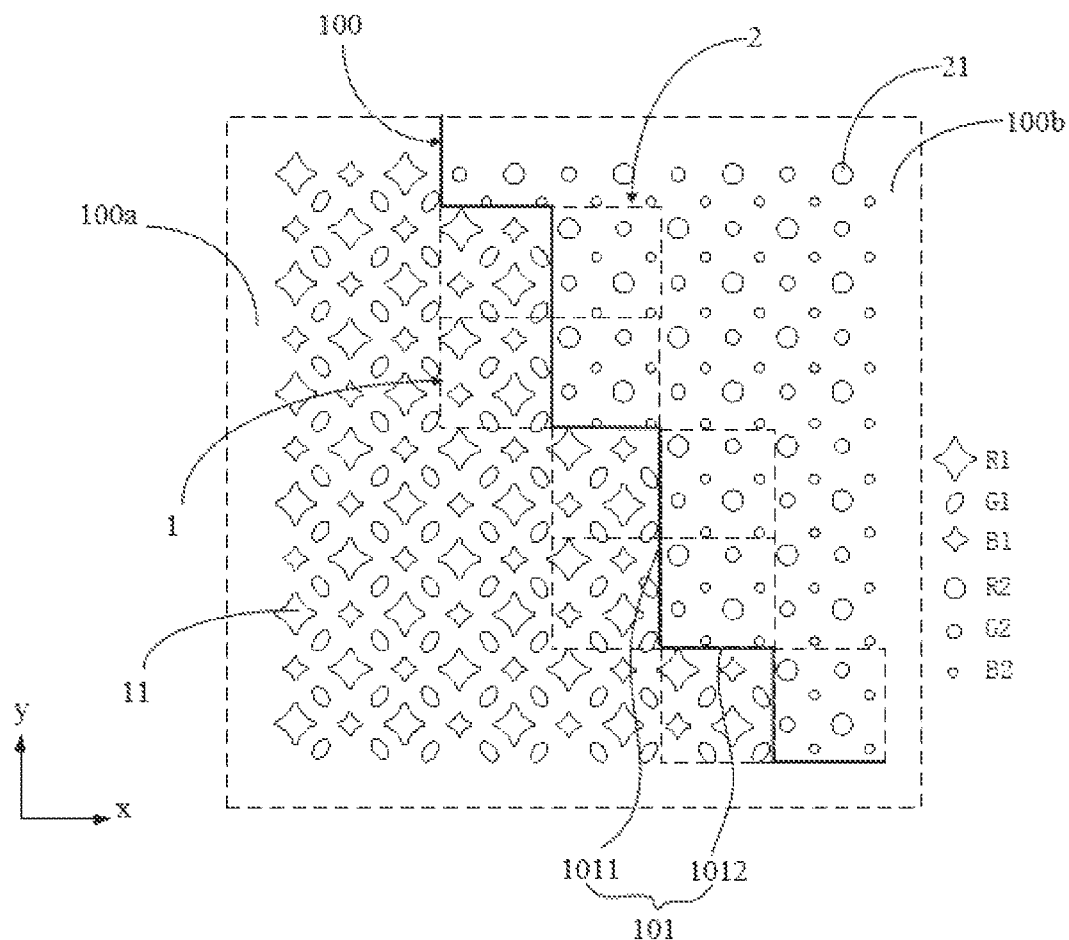
FIG. 3 is a schematic diagram of a partial pixel structure of the display panel in FIG. 2.

Please refer to FIG. 2 and FIG. 3. A plurality of first pixel repeating units 1 are disposed on the main display region 100a, and a plurality of second pixel repeating units 2 are disposed on the sub display region 100b. Both the first pixel repeating units 1 and the second pixel repeating units 2 are configured to emit light, so that both the main display region 100a and the sub display region 100b can display images. A bend line boundary 100 is formed between the main display region 100a and the sub display region 100b. The bend line boundary 100 is disposed at an edge of the sub display region 100b. The bend line boundary 100 includes a plurality of bending units 101. The plurality of the bending units 101 are connected end to end in sequence. Each of the bending units 101 corresponds to at least one of the second pixel repeating units 2, so that the second pixel repeating units 2 disposed at the bend line boundary 100 between the main display region 100a and the sub display region 100b are complete. Thus, the pixel repeating units (i.e., the second pixel repeating units 2) in the sub display region 100b are consistent with the pixel repeating units at its edge, thereby reducing a display difference between the sub display region 100b and its edge, which is beneficial to improve visual performance of the sub display region 100b.

Specifically, each of the bending units 101 includes a first bending edges 1011 and a second bending edge 1012 that intersect each other. An intersection of one end of the first bending edge 1011 and one end of the second bending edge 1012 forms a concave corner. The first bending edge 1011 extends along a first direction y or along a direction opposite to the first direction y. The second bending edge 1012 extends along a second direction x or along a direction opposite to the second direction x. The first bending edge 1011 of one bending unit 101 is connected to the second bending edge 1012 of the adjacent bending unit 101 arranged close to the first bending edge 1011. Furthermore, the first bending edge 1011 and the second bending edge 1012 serve as a quadrilateral area formed by two adjacent edges to form an interval 102 of bending edges. The interval 102 of bending edges includes the concave corner. The other two edges of the interval 102 of bending edges are arranged in parallel with the first bending edge 1011 and the second bending edge 1012, respectively. The interval 102 of bending edges is disposed in the sub display region 100b.

Please refer to FIG. 3, the second pixel repeating units 2 corresponding to the first bending edge 1011 and the second bending edge 1012 are disposed in the interval 102 of bending edges. The first bending edge 1011 and the second bending edge 1012 correspond to at least one of the second pixel repeating units 2, respectively. Thus, the sub display region 100b is correspondingly consistent with the pixel repeating units at the first bending edge 1011 and the second bending edge 1012, thereby reducing the display difference between the sub display region 100b and its edges. In addition, the bend line boundary 100 between the main display region 100a and the sub display region 100b can be uniformly transitioned, so that there is no display interruption or discontinuous boundary visually. This can reduce a zigzag pattern caused by the bend line boundary 100, thereby improving a display quality.

For example, the first bending edge 1011 and the second bending edge 1012 respectively correspond to one of the second pixel repeating units 2. At this time, a size of the second pixel repeating unit 2 in the first direction y is equal to a size of the first bending edge 1011 in the first direction y, and a size of the second pixel repeating unit 2 in the second direction x is equal to a size of the second bending edge 1012 in the second direction x.

Furthermore, the first bending edge 1011 corresponds to M second pixel repeating units 2. The second bending edge 1012 corresponds to the N second pixel repeating units 2. M is a positive integer, and N is a positive integer. For example, M can be 1, 2, 3, 4, 5, 6, etc., and N can be 1, 2, 3, 4, 5, 6, etc. That is, the first bending edge 1011 and the second bending edge 1012 respectively correspond to integer multiples of the second pixel repeating units 2. Values of M and N may be the same or different, depending on whether the size of the first bending edge 1011 in the first direction y and the size of the second bending edge 1012 in the second direction x are the same. For example, in one of the bending units 101 shown in FIG. 3, the first bending edge 1011 corresponds to two of the second pixel repeating units 2, and the second bending edge 1012 corresponds to one of the second pixel repeating units 2.

Correspondingly, the bend line boundary 100 is disposed at the edge of the main display region 100a close to the sub display region 100b. Similar to an arrangement and a principle of the second pixel repeating units 2 disposed at the bend line boundary 100, the first bending edge 1011 and the second bending edge 1012 correspond to at least one of the first pixel repeating units 1, respectively. The first pixel repeating unit 1 is arranged corresponding to the convex corner formed by the first bending edge 1011 and the second bending edge 1012. Furthermore, the first bending edge 1011 corresponds to P first pixel repeating units 1. The second bending edge corresponds to Q first pixel repeating units 1. P is a positive integer, and Q is a positive integer. For example, P can be 1, 2, 3, 4, 5, 6, etc., and Q can be 1, 2, 3, 4, 5, 6, etc. That is, the first bending edge 1011 and the second bending edge 1012 correspond to integer multiples of the first pixel repeating units 1, respectively. Values of P and Q may be the same or different, depending on whether the size of the first bending edge 1011 in the first direction y and the size of the second bending edge 1012 in the second direction x are the same. For example, in one of the bending units 101 shown in FIG. 3, the first bending edge 1011 corresponds to two of the first pixel repeating units 1, and the second bending edge 1012 corresponds to one of the first pixel repeating units 1. Similarly, such an arrangement can make that the pixel repeating units (i.e., the first pixel repeating units 1) in the main display region 100a are consistent with the pixel repeating units at its edge, thereby reducing a display difference between the main display region 100a and its edge, which is beneficial to improve visual performance of the main display region 100a.

An included angle between the first bending edge 1011 and the second bending edge 1012 may be 90 degrees. At this time, the first direction y and the second direction x are perpendicular to each other, the bending units 101 are formed in a step shape, and the bend line boundary 100 is distributed stepwise.

It should be noted that because the size of the first bending edge 1011 in the first direction y and the size of the second bending edge 1012 in the second direction x are too large, the zigzag pattern of the images at the bend line boundary 100 will increase. Therefore, in the embodiment of the present disclosure, the size of the first bending edge 1011 in the first direction y and the size of the second bending edge 1012 in the second direction x should not be set too large. In other words, the values of M, N, P, and Q should not be too large.

Furthermore, a shape of the bend line boundary 100 may be a symmetrical pattern. In this case, a shape of the sub display region 100b is a symmetrical pattern. The bend line boundary 100 has a first symmetry axis A-A and a second symmetry axis B-B. The first symmetry axis A-A and the second symmetry axis B-B have an intersection point O. Sizes of the plurality of first bending edges 1011 increase in a direction parallel to the first symmetry axis A-A and approaching the intersection point O. Sizes of the plurality of second bending edges 1012 increase in a direction parallel to the second symmetry axis B-B and approaching the intersection point O. The direction parallel to the first symmetry axis A-A and approaching the intersection point O is the first direction y or an opposite direction of the first direction y. The direction parallel to the second symmetry axis B-B and approaching the intersection point O is the second direction x or an opposite direction of the second direction x.

Preferably, the first symmetry axis A-A is perpendicular to the second symmetry axis B-B. The first bending edge 1011 is parallel to the first symmetry axis A-A. The second bending edge 1012 is parallel to the second symmetry axis B-B.

In the embodiment of the present disclosure, a number of the first pixel repeating units 1 in the main display region 100*a* per unit area is equal to a number of the second pixel repeating units 2 in the sub display region 100*b* per unit area. That is, the main display region 100*a* and the sub display region 100*b* have the same pixel density (i.e., pixel per inch, PPI). Therefore, the main display region 100*a* and the sub display region 100*b* have the same display richness. On the one hand, an overall display difference between a display screen of the main display region 100*a* and a display screen of the sub display region 100*b* can be reduced. On the other hand, the display difference between the main display region 100*a* and the sub display region 100*b* at the bend line boundary 100 can be further reduced.

Specifically, the first pixel repeating unit 1 includes a plurality of first sub-pixels 11. The second pixel repeating unit 2 includes a plurality of second sub-pixels 21. The plurality of first sub-pixels 11 may include a first red sub-pixel R1, a first green sub-pixel G1, and a first blue sub-pixel B1. The plurality of second sub-pixels 21 may include a second red sub-pixel R2, a second green sub-pixel G2, and a second blue sub-pixel B2.

Figure 4:
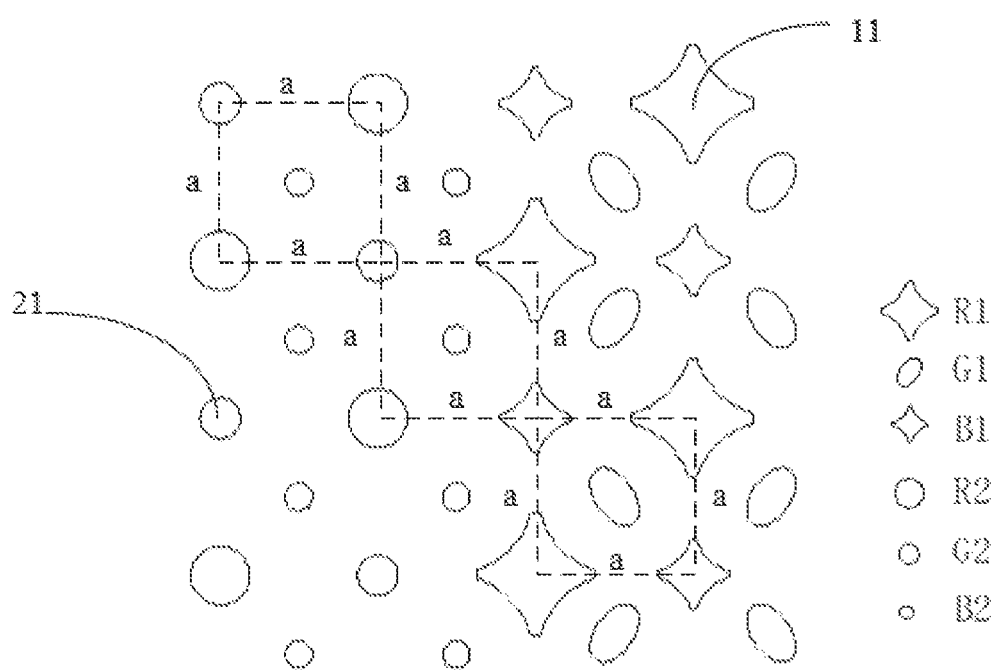
FIG. 4 is a schematic diagram of a partially enlarged pixel structure of the display panel in FIG. 3.

An arrangement of the plurality of first sub-pixels 11 in the main display region 100*a* is consistent with an arrangement of the plurality of second sub-pixels 21 in the sub display region 100*b*, so that the display difference between the main display region 100*a* and the sub display region 100*b* can be further reduced. It should be noted that the "arrangement" here includes arrangement type and spacing. That is, on the one hand, the arrangement of the plurality of first sub-pixels 11 is consistent with the arrangement type of the plurality of second sub-pixels 21. On the other hand, referring to FIG. 4, a distance between any two first sub-pixels 11 is equal to a distance between any two corresponding second sub-pixels 21. For example, a distance between center points of two adjacent first sub-pixels 11 is equal to a distance between center points of two adjacent second sub-pixels 21, and is equal to a distance between the first sub-pixels 11 and its adjacent second sub-pixels 21, for example, they are a.

The first pixel repeating units 1 and the second pixel repeating units 2 are arranged in BGRG and RGBG. Taking the second pixel repeating units 2 as an example for description, the second pixel repeating unit 2 includes two second red sub-pixels R2, four second green sub-pixels G2, and two second blue sub-pixels B2. Specifically, the second pixel repeating unit 2 includes a 4×4 sub-pixel matrix. The second green sub-pixels G2 are arranged in the first row and the second column, the first row and the fourth column, the third row and the second column, and the third row and the fourth column. The second blue sub-pixel B2 are arranged in the second row and first column and the fourth row and third column. The second red sub-pixels R2 are arranged in the fourth row and the first column and the second row and the third column.

It can be understood that the main display region 100*a* and the sub display region 100*b* have the same PPI. In each of the bending units 101, the number of the first pixel repeating units 1 corresponding to the first bending edge 1011 is equal to the number of the second pixel repeating units 2 corresponding to the first bending edge 1011. The number of the first pixel repeating units 1 corresponding to the second bending edge 1012 is equal to the number of the second pixel repeating units 2 corresponding to the second bending edge 1012. That is, M and P are equal, and N and Q are equal.

Furthermore, in order to meet lighting requirements of the camera disposed corresponding to the sub display region 100*b* and obtain a better light-sensitive effect, a pixel aperture area of the first sub-pixels 11 is greater than a pixel aperture area of the second sub-pixels 21. Within a unit area, the sub display region 100*b* has a larger non-pixel arrangement area than the main display region 100*a*. In other words, the sub display region 100*b* has a larger area of a light-transmitting region relative to the main display region 100*a*, so that the light transmittance of the sub display region 100*b* meets requirements. In addition, the main display region 100*a* and the sub display region 100*b* have the same PPI. In comparison with a solution of increasing the light transmittance by reducing the PPI of the sub display region 100*b*, the number of pixels in the sub display region 100*b* per unit area is relatively increased. As a result, images displayed by the sub display region 100*b* are more delicate, display richness is increased, and display performance is improved.

Figure 5:
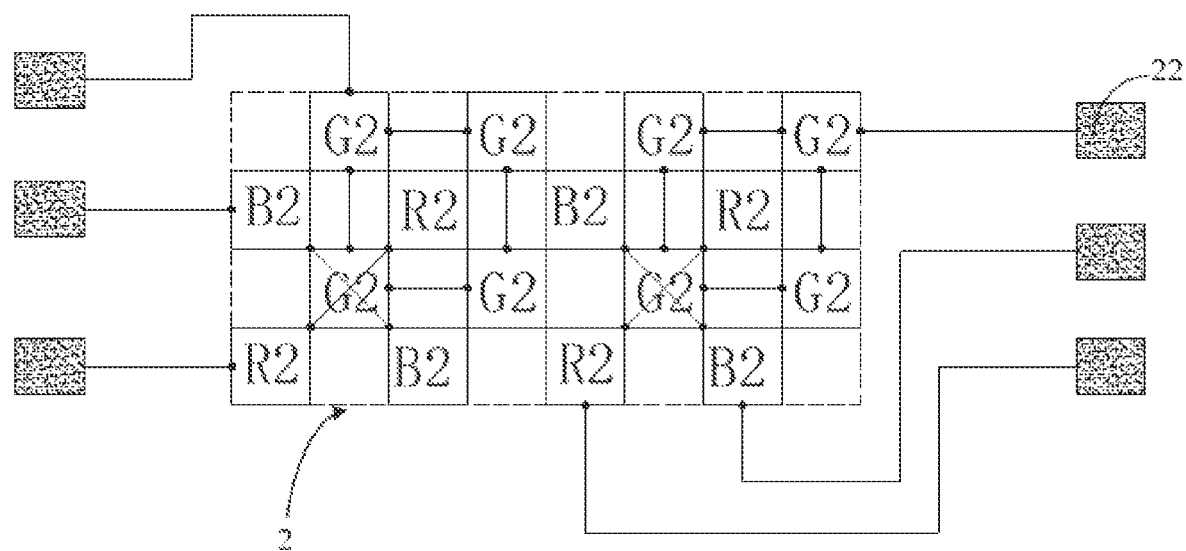
FIG. 5 is a schematic diagram showing a connection relationship between pixel drive circuit units and second pixel repeating units of an embodiment of the present disclosure.

Referring to FIG. 5, the sub display region 100*b* is provided with a plurality of pixel drive circuit units 22 for driving the second sub-pixels 21 to emit light. The plurality of the second sub-pixels 21 with the same color in one second pixel repeating unit 2 are electrically connected to one of the pixel drive circuit unit 22. Thus, the number of pixel drive circuit units 22 can be reduced, a wiring area of the sub display region 100*b* can be reduced, the light transmittance of the sub display region 100*b* can be further improved, and the shooting performance of the under-screen camera can be increased without excessively degrading the display performance of the sub-display area 100*b*. For example, the plurality of second red sub-pixels R2 in the same second pixel repeating unit 2 are electrically connected to the same pixel drive circuit unit 22. The plurality of second green sub-pixels G2 in the same second pixel repeating unit 2 are electrically connected to the same pixel drive circuit unit 22. The plurality of second blue sub-pixels B2 in the same second pixel repeating unit 2 are electrically connected to the same pixel drive circuit unit 22.

Figure 6:
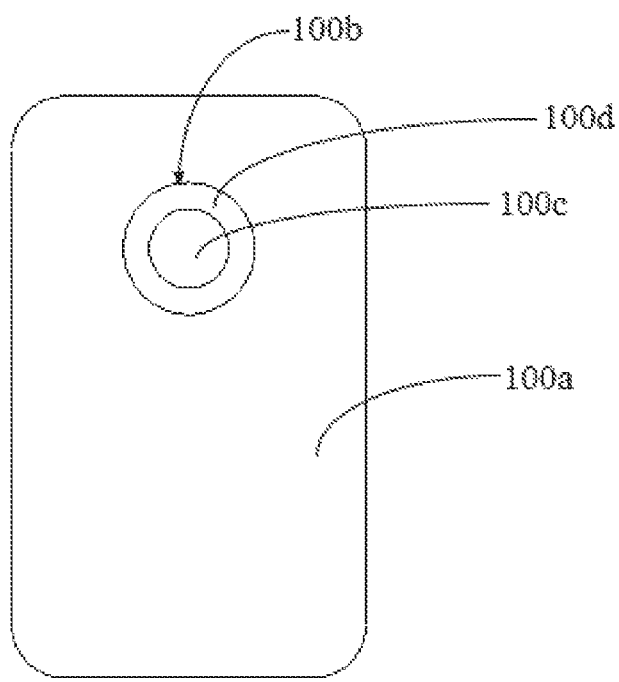
FIG. 6 is a plan view of a display panel of another embodiment of the present disclosure.

Furthermore, please refer to FIG. 6. FIG. 6 is different from FIG. 1 in that the sub display region 100*b* includes a display and light transmission area 100*c* and a transition and display area 100*d* disposed between the main display area 100*a* and the display and light transmission area 100*c*. A camera is correspondingly arranged in the display and light transmission area 100*c*. The bend line boundary 100 is formed between the main display region 100*a* and the transition and display area 100*d*. A shape of the display and light transmission area 100*c* may be a circle, a rectangle, a rounded rectangle, or an irregular polygon. Preferably, in this embodiment, the shape of the display and light transmission area 100*c* is circular.

Figure 7:
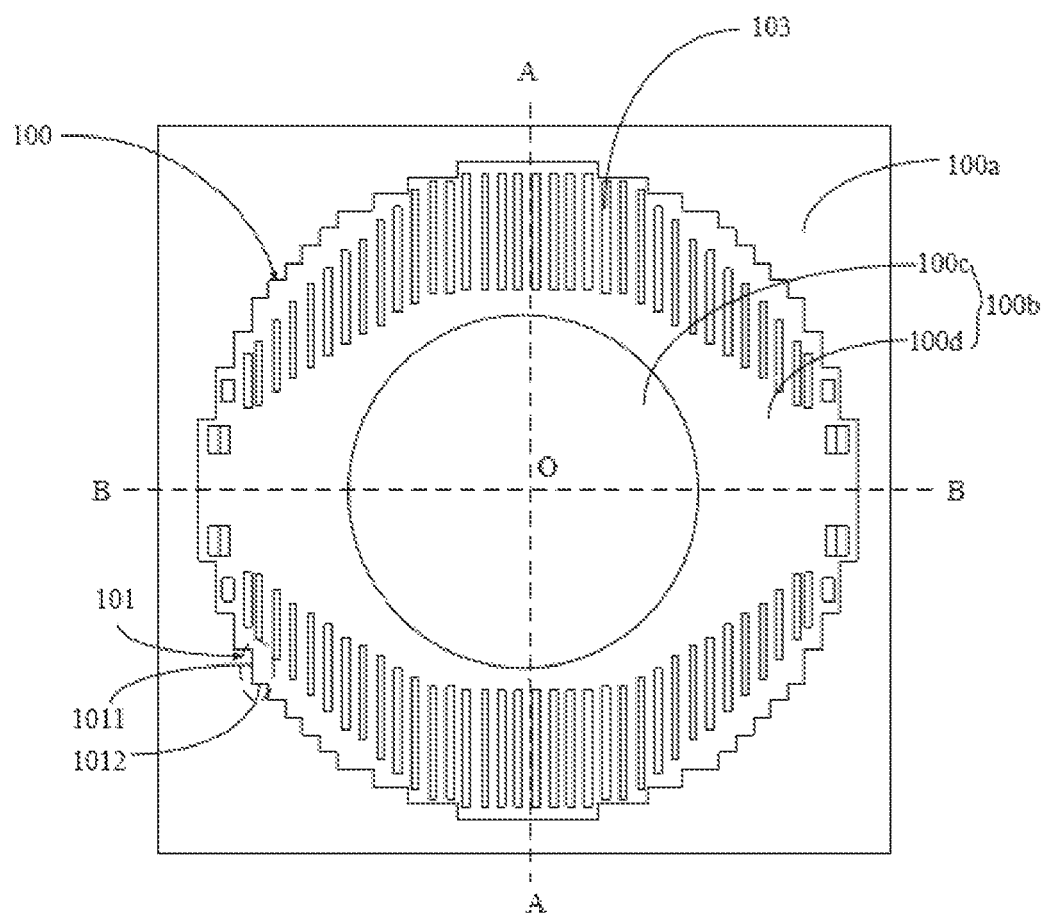
FIG. 7 is a schematic diagram of a partial drive circuit of the display panel in FIG. 6.
Figure 8:
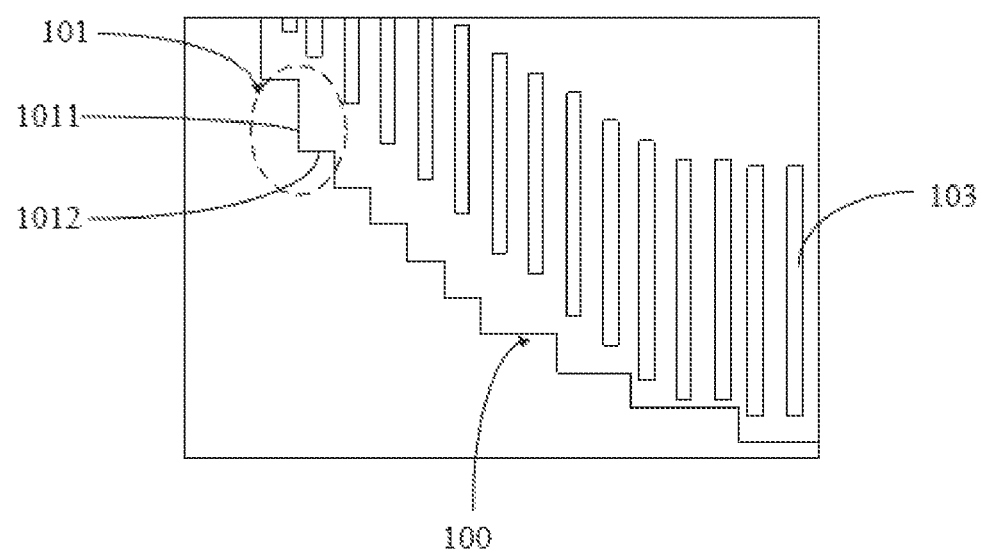
FIG. 8 is a schematic diagram of a partial enlarged structure of the display panel in FIG. 7.

Referring to FIG. 7 and FIG. 8, the transition and display area 100*d* is provided with a plurality of pixel drive circuit islands 103, and the plurality of pixel drive circuit islands 103 are arranged along an edge of the display and light transmission area 100*c*. The pixel drive circuit units 22 are arranged in the transition and display area 100d. It should be noted that the pixel drive circuit islands 103 are formed by combining the pixel drive circuit units 22 moving from the display and light transmission area 100c to the transition and display area 100d and the pixel drive circuit units 22 arranged in the transition and display area 100d in an island shape and centrally distributed. A light transmission area of the display panel is concentrated on the display and light transmission area 100c, thereby increasing the light transmittance of the display and light transmission area 100c. Each pixel drive circuit island 103 includes a plurality of pixel drive circuit units 22.

Specifically, a plurality of the pixel drive circuit islands 103 are mirrored with respect to the first symmetry axis A-A and arranged on edges of opposite sides of the display and light transmission area 100c. A plurality of the pixel drive circuit islands 103 are mirrored with respect to the second symmetry axis B-B and arranged on edges of opposite sides of the display and light transmission area 100c. When the display and light transmission area 100c is circular, a plurality of the pixel drive circuit islands 103 are arranged on the periphery of the display and light transmission area 100c, and arranged in a circular ring shape. The pixel drive circuit islands 103 and the bending units 101 are arranged correspondingly. Specifically, part of the pixel drive circuit islands 103 may be disposed correspondingly to the same bending unit 101. Part of the pixel drive circuit islands 103 may be disposed correspondingly to different bending units 101. The plurality of pixel drive circuit islands 103 arranged corresponding to the same bending unit 101 are all arranged side by side in a straight line along a direction parallel to the second symmetry axis B-B. The pixel drive circuit islands 103 corresponding to the different bending units 101 are arranged in a stepwise arrangement along a direction parallel to the first symmetry axis A-A.

The present disclosure also provides a display device. The display device includes the above-mentioned display panel and a photosensitive element. The photosensitive element is disposed on one side of the display panel, and is arranged correspondingly to the sub display region 100b. Specifically, the photosensitive element may be a camera, an optical touch component, a fingerprint recognition sensor, etc. The display device can be any product or component with a display function, such as a mobile phone, a tablet, a television, a monitor, a notebook, a digital photo frame, a navigator, etc.

Advantages of the present disclosure are as follows. In the display panel and the display device of the present disclosure, the bend line boundary is formed between the main display region and the sub display region. The bend line boundary includes the plurality of bending units. Each bending unit corresponds to at least one second pixel repeating unit disposed in the sub display region, so that the second pixel repeating unit disposed at the bend line boundary between the main display region and the sub display region is complete. Therefore, the pixel repeating units of the sub display region are consistent with the pixel repeating units at its edge, which can reduce a display difference between the sub display region and its edge, and improve visual performance of the sub display region.

In summary, although the present disclosure has been disclosed as above in preferred embodiments, the above preferred embodiments are not intended to limit the present disclosure. Those of ordinary skill in the art can make various changes and modifications without departing from the spirit and scope of the present disclosure. Therefore, the protection scope of the present disclosure is subject to the scope defined by the appended claims.

What is claimed is:

1. A display panel, comprising a main display region, at least one sub display region, a plurality of first pixel repeating units disposed in the main display region, and a plurality of second pixel repeating units disposed in the sub display region, wherein the main display region forms a majority aera of the display panel, each second pixel repeating unit in the sub display region has a light-transmitting region with a larger area than a light-transmitting region of each first pixel repeating unit in the main display region, the main display region is adjacent to the sub display region and surrounds entirety or at least one portion of the sub display region;
   wherein a bend line boundary is formed between the main display region and the sub display region, the bend line boundary comprises a plurality of bending units, each of the bending units corresponds to at least one of the second pixel repeating units;
   wherein a number of the first pixel repeating units in the main display region per unit area is equal to a number of the second pixel repeating units in the sub display region per unit area;
   wherein the first pixel repeating units in the main display region comprise a plurality of first sub-pixels in the main display region, and the second pixel repeating units in the sub display region comprise a plurality of second sub-pixels in the sub display region;
   wherein each of the first pixel repeating units is a pixel that comprise first sub-pixels of at least three primary colours, and each of the second pixel repeating units is a pixel that comprise second sub-pixels of at least three primary colours; and
   wherein an arrangement of first sub-pixels in each first pixel repeating unit in the main display region is consistent with an arrangement of the second sub-pixels in each second pixel repeating unit in the sub display region;
   wherein the display panel further comprises a plurality of pixel drive circuit units disposed in the sub display region and configured to drive the second sub-pixels to emit light,
   wherein a plurality of the second sub-pixels with a same color in the second pixel repeating units are electrically connected to one of the pixel drive circuit units.

2. The display panel according to claim 1, wherein each of the bending units comprises a first bending edge and a second bending edge that intersect each other, and both the first bending edge and the second bending edge correspond to at least one of the second pixel repeating units.

3. The display panel according to claim 2, wherein the first bending edge corresponds to M second pixel repeating units, and the second bending edge corresponds to N second pixel repeating units, and wherein M is a positive integer and N is a positive integer.

4. The display panel according to claim 2, wherein both the first bending edge and the second bending edge correspond to at least one of the first pixel repeating units.

5. The display panel according to claim 4, wherein the first bending edge corresponds to P first pixel repeating units, and the second bending edge corresponds to Q first pixel repeating units, and wherein P is a positive integer and Q is a positive integer.

6. The display panel according to claim 2, wherein an included angle between the first bending edge and the second bending edge is 90 degrees.

7. The display panel according to claim 2, wherein the bend line boundary comprises a first symmetry axis and a second symmetry axis, the first symmetry axis and the second symmetry axis have an intersection point, sizes of plurality of the first bending edges gradually increase in a direction parallel to the first symmetry axis and toward the intersection point, and sizes of plurality of the second bending edges gradually increase in a direction parallel to the second symmetry axis and toward the intersection point.

8. The display panel according to claim 7, wherein the first symmetry axis is arranged perpendicular to the second symmetry axis, the first bending edge is arranged parallel to the first symmetry axis, and the second bending edge is arranged parallel to the second symmetry axis.

9. The display panel according to claim 1, wherein a pixel aperture area of the first sub-pixels is greater than a pixel aperture area of the second sub-pixels.

10. The display panel according to claim 1, wherein the sub display region comprises a display and light transmission area and a transition and display area between the main display region and the display and light transmission area, and the bend line boundary is formed between the main display region and the transition and display area; and
    wherein the pixel drive circuit units are disposed in the transition and display area.

11. A display device, comprising;
the display panel of claim 1; and
a photosensitive element disposed on one side of the display panel and corresponding to the sub display region.

\* \* \* \* \*